United States Patent
Fujita et al.

(10) Patent No.: US 9,424,906 B2
(45) Date of Patent: *Aug. 23, 2016

(54) TIMING CONTROLLER WITH DELAY TIME UNITS FOR A SEMICONDUCTOR STORAGE DEVICE

(71) Applicant: KABUSHIKI KAISHA TOSHIBA, Minato-Ku, Tokyo (JP)

(72) Inventors: Katsuyuki Fujita, Tokyo (JP); Katsuhiko Hoya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/680,951

(22) Filed: Apr. 7, 2015

(65) Prior Publication Data

US 2015/0213870 A1    Jul. 30, 2015

Related U.S. Application Data

(63) Continuation of application No. 13/601,037, filed on Aug. 31, 2012, now Pat. No. 9,025,400.

(30) Foreign Application Priority Data

Nov. 2, 2011  (JP) .................................. 2011-241203

(51) Int. Cl.
    *G11C 11/16*     (2006.01)
    *G11C 7/22*      (2006.01)
    *G11C 8/18*      (2006.01)

(52) U.S. Cl.
    CPC .......... *G11C 11/1693* (2013.01); *G11C 7/222* (2013.01); *G11C 8/18* (2013.01); *G11C 11/16* (2013.01)

(58) Field of Classification Search
    CPC ..... G11C 11/1693; G11C 8/18; G11C 11/16; G11C 7/222
    See application file for complete search history.

(56) References Cited

U.S. PATENT DOCUMENTS

| 5,519,654 | A  | 5/1996  | Kato et al.       |
|-----------|----|---------|-------------------|
| 6,052,331 | A  | 4/2000  | Araki et al.      |
| 6,256,224 | B1 | 7/2001  | Perner et al.     |
| 7,466,577 | B2 | 12/2008 | Sekiguchi et al.  |

(Continued)

FOREIGN PATENT DOCUMENTS

| JP | H01-125800 | 5/1989 |
| JP | H05-012891 | 1/1993 |

(Continued)

OTHER PUBLICATIONS

Japanese Office Action for Japanese Application No. 2011-241203, mailed Sep. 2, 2014, in 5 pages.

*Primary Examiner* — J. H. Hur
(74) *Attorney, Agent, or Firm* — Knobbe, Martens, Olson & Bear LLP

(57) ABSTRACT

A semiconductor storage device according to the present embodiment includes a plurality of memory units respectively comprising a plurality of memory cells. A data bus is shared by the memory units and transfers data from the memory units or to the memory units. A timing controller includes a delay time unit shared by the memory units sharing the data bus. The timing controller is configured to output a control signal for driving the memory units after a predetermined delay time elapses since receiving an input signal.

11 Claims, 8 Drawing Sheets

(56) References Cited

U.S. PATENT DOCUMENTS

| | | |
|---|---|---|
| 7,764,564 B2 | 7/2010 | Saito et al. |
| 7,768,867 B2 | 8/2010 | Nishio et al. |
| 8,189,363 B2 | 5/2012 | Tsuchida et al. |
| 8,737,160 B2 | 5/2014 | Hayashi |
| 9,025,400 B2 * | 5/2015 | Fujita .................. G11C 7/222 365/189.05 |
| 2006/0233012 A1 | 10/2006 | Sekiguchi et al. |
| 2007/0291557 A1 | 12/2007 | Nishio et al. |
| 2008/0304344 A1 * | 12/2008 | Do .......................... G11C 8/08 365/201 |
| 2009/0168566 A1 | 7/2009 | Chung et al. |
| 2010/0321980 A1 | 12/2010 | Fujita et al. |
| 2011/0249485 A1 | 10/2011 | Fujita et al. |
| 2012/0063215 A1 | 3/2012 | Takahashi et al. |
| 2012/0114086 A1 | 5/2012 | Hayashi |

FOREIGN PATENT DOCUMENTS

| | | |
|---|---|---|
| JP | 2002-008368 | 1/2002 |
| JP | 2006-277870 | 10/2006 |
| JP | 2007-335528 | 12/2007 |
| JP | 2008-140220 | 6/2008 |
| JP | 2009-252286 | 10/2009 |
| JP | 2010-049730 | 3/2010 |
| JP | 2012-099189 | 5/2012 |

* cited by examiner

US 9,424,906 B2

TIMING CONTROLLER WITH DELAY TIME UNITS FOR A SEMICONDUCTOR STORAGE DEVICE

CROSS REFERENCE TO RELATED APPLICATIONS

This application is a continuation of U.S. patent application Ser. No. 13/601,037, filed on Aug. 31, 2012, which is based upon and claims the benefit of priority from the prior Japanese Patent Application No. 2011-241203, filed on Nov. 2, 2011; the entire contents of these applications are incorporated herein by reference.

FIELD

The embodiments of the present invention relate to a semiconductor device.

BACKGROUND

Conventionally, a semiconductor storage device such as an MRAM (Magnetic Random Access Memory) includes a common data bus provided to be common to a plurality of memory units and continuously transfer data via the common data bus (an interleaving operation). In this case, the timing of transfer needs to be controlled in such a manner that the memory units sharing the data bus do not transfer data in an overlapped manner, or data is not transferred to the memory units in an overlapped manner.

Conventionally, in order to control a data transfer timing for each of memory units, a delay circuit needs to be provided so as to correspond to each of the memory units. However, according to such a delay circuit, a delay time varies according to process variations. Such variations in the delay time may cause data to be transferred in an overlapped manner in a data bus.

DETAILED DESCRIPTION

A semiconductor device according to the present embodiment includes a plurality of memory units respectively comprising a plurality of memory cells. A data bus is shared by the memory units and transfers data from the memory units or to the memory units. A timing controller includes a delay time unit shared by the memory units sharing the data bus. The timing controller is configured to output a control signal for driving the memory units after a predetermined delay time elapses since receiving an input signal.

Embodiments will now be explained with reference to the accompanying drawings. The present invention is not limited to the embodiments.

First Embodiment

Figure 1:
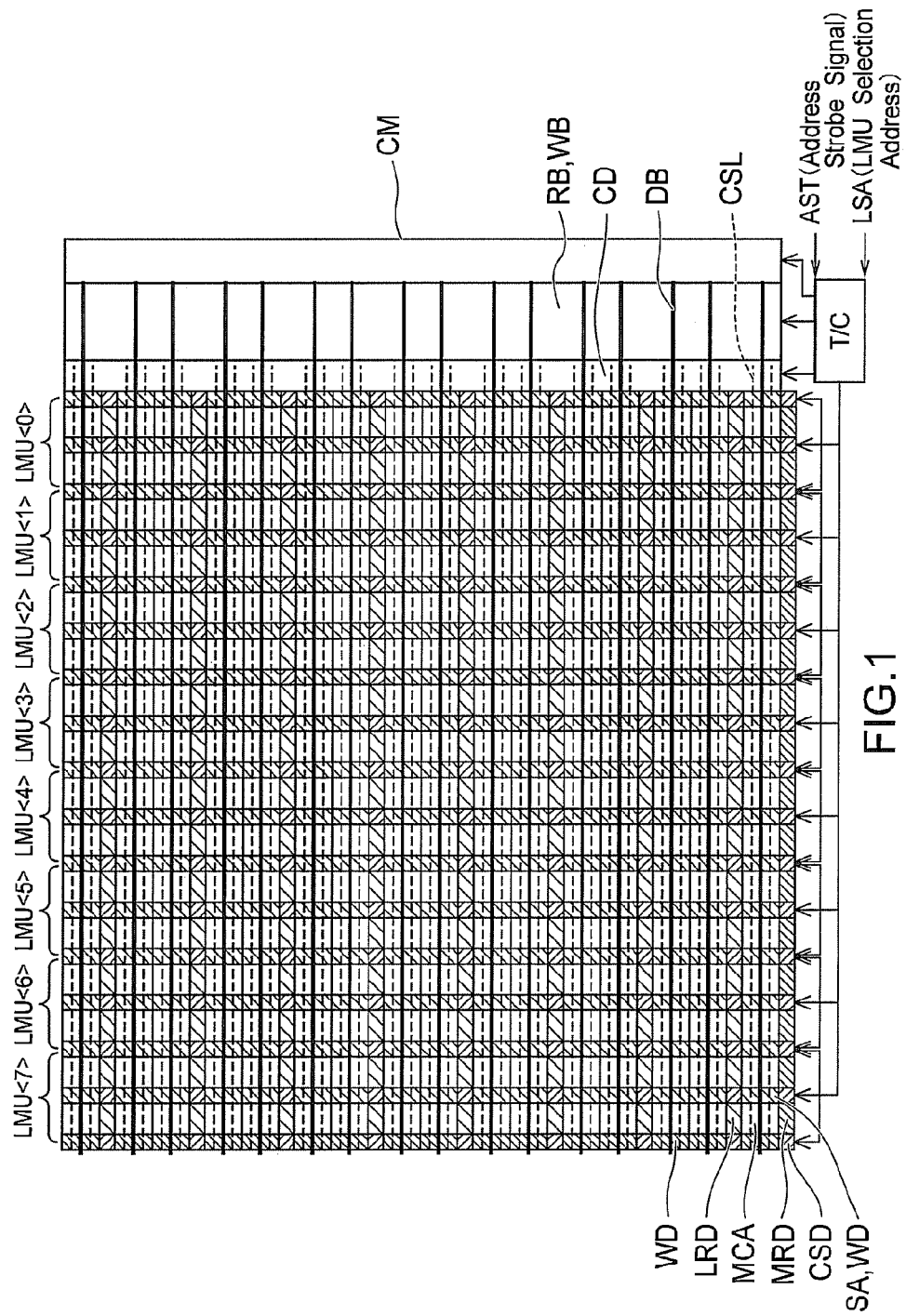
FIG. 1 is a block diagram of a memory chip of a magnetic random-access memory (hereinafter, "MRAM") according to a first embodiment.
Figure 2:
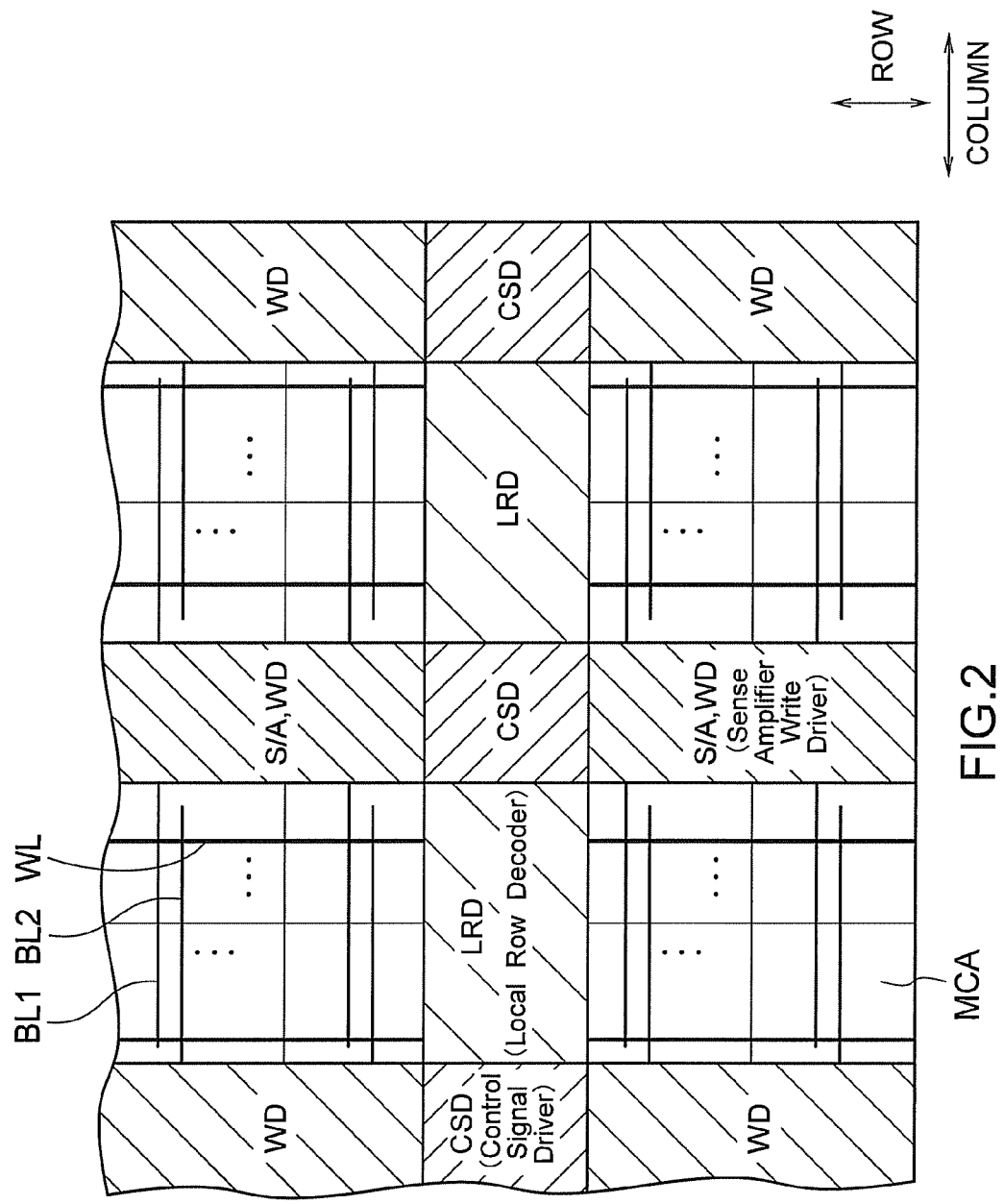
FIG. 2 is a block diagram further showing four memory units MU in an enlarged manner.

FIG. 1 is a block diagram of a memory chip of a magnetic random-access memory (hereinafter, "MRAM") according to a first embodiment. FIG. 2 is a block diagram further showing four memory units MU in an enlarged manner. The first embodiment can be applied to memories using a resistance variable element (such as a PCRAM and an ReRAM) other than the MRAM and general memories such as an SRAM and a DRAM.

The MRAM according to the first embodiment includes a memory cell array MCA, a sense amplifier SA, a write driver WD, a main row decoder MRD, a local row decoder LRD, a read buffer RB, a column decoder CD, a timing controller T/C, a control signal driver CSD, a common data bus DB, and a column selection line CSL.

For example, the memory cell array MCA includes a plurality of memory cells MC two-dimensionally arranged in a matrix. Each of the memory cells MC is arranged so as to correspond to an intersection of a bit line pair BL1, BL2 and a word line WL. That is, an end of a memory cell MC is connected to one bit line BL1 of the bit line pair and the other end thereof is connected to the other bit line BL2 of the bit line pair. The bit line pair BL1, BL2 extends in a column direction. The word line WL extends in a row direction orthogonal to the column direction.

The memory cell MC includes a MTJ (Magnetic Tunnel Junction) element utilizing a TMR (tunneling magnetoresistive) effect and a cell transistor, and stores therein digital data by a change in magnetoresistance caused by a spin-polarized tunneling effect.

A plurality of memory cell arrays MCA simultaneously accessed at the time of data read or data write configure local memory units LMU<0> to LMU<7>, respectively. That is, memory cell arrays MCA included in each local memory unit LMU<i> (i=0 to 7) are accessed at the same timing.

The sense amplifier SA is connected via the bit line BL1 to memory cells MC and has a function of detecting data of the memory cells MC, for example. The write driver WD is connected via the bit lines BL1 and BL2 to memory cells MC and has a function of writing data in the memory cells MC, for example. At the time of data read, the bit line BL2 is connected to a reference voltage (a ground). At the time of data write, the write driver WD applies a high-level voltage to the bit line BL1 or to the bit line BL2 depending on a logic of write data.

The main row decoder MRD receives a row address and sends this row address to the local row decoder LRD. The local row decoder LRD applies a voltage to a word line WL selected according to the row address.

The column decoder CD is configured to drive the sense amplifier SA or the write driver WD via the column selection line CSL selected according to a column address and to apply a voltage to a bit line pair BL1, BL2 of a selected column.

The common data bus DB is shared by the local memory units LMU<0> to LMU<7>. The common data bus DB transfers data from the local memory units LMU<0> to LMU<7> at different timings or transfers data to the local memory units LMU<0> to LMU<7> at different timings.

According to the first embodiment, 16 common data-bus pair groups DB are shared by the local memory units LMU<0> to LMU<7>. However, the number of common data buses DB shared by the local memory units LMU<0> to LMU<7> is not limited to this number. While the number of the local memory units LMU<0> to LMU<7> sharing the data bus DB is 8 in the first embodiment, the number of local memory units sharing the data bus DB is not limited to this number.

The read buffer RB receives read data from the sense amplifier SA via the common data bus DB and temporarily holds the read data. Write data is transferred from a write buffer via the common data bus DB to the write driver WD.

The timing controller T/C controls operation timings of the local memory units LMU<0> to LMU<7> in such a manner that a plurality of memory cell arrays MCA included in the local memory units LMU<0> to LMU<7> connected to the same common data-bus pair group DB can transfer data without overlapping the data with other data. Accordingly, the local memory units LMU<0> to LMU<7> can transfer data to the common data bus DB at different timings or receive data from the common data bus DB at different timings. The timing controller T/C is provided to be common to the local memory units LMU<0> to LMU<7>. The timing controller T/C also controls the read buffer RB, a write buffer WB, and a cache memory CM in such a manner that the memory can perform an interleaving operation.

The control signal driver CSD is configured to receive a command from the timing controller T/C and operate the sense amplifier SA, the write driver WD, and the local row decoder LRD.

Figure 3:
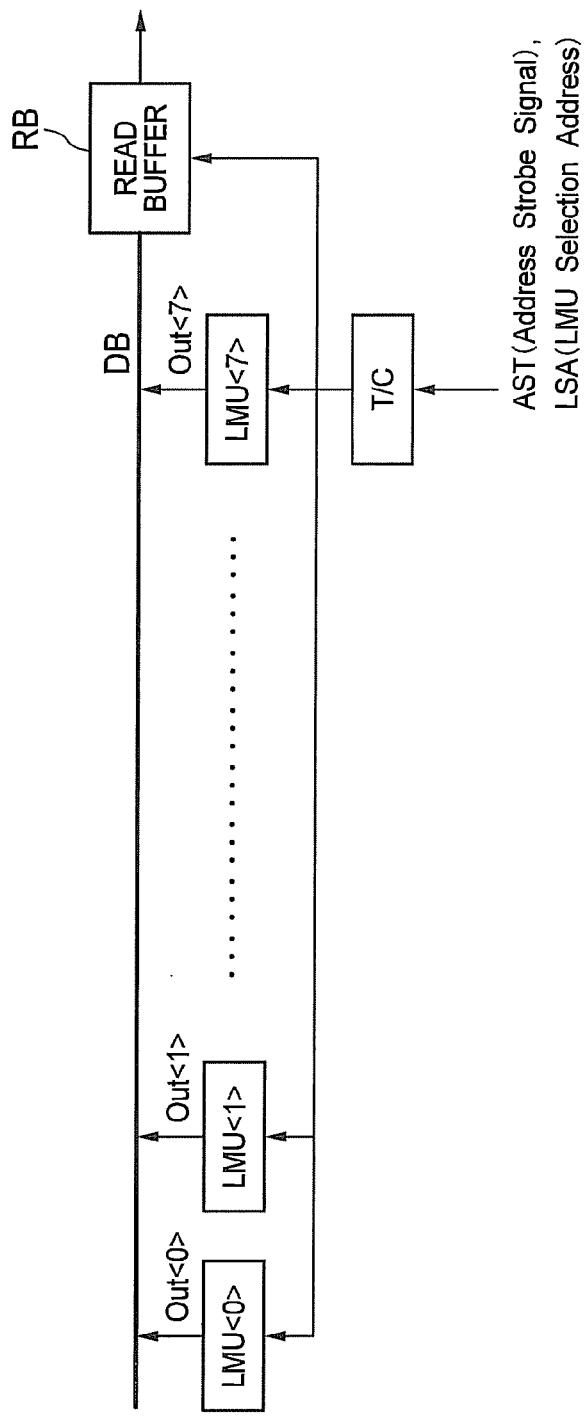
FIG. 3 is a block diagram of a relationship between the common data bus DB, the local memory units LMU<0> to LMU<7>, and the timing controller T/C according to the first embodiment.

FIG. 3 is a block diagram of a relationship between the common data bus DB, the local memory units LMU<0> to LMU<7>, and the timing controller T/C according to the first embodiment. FIG. 3 can be regarded as showing a plurality of memory cell arrays MCA of a selected column and a common data-bus pair group DB of the selected column.

The timing controller T/C is provided to be common to the local memory units LMU<0> to LMU<7> sharing a single or a plurality of common data-bus pair group(s) DB. The timing controller T/C receives an address strobe signal AST and an LMU selection-address signal LSA<0:2> and controls the local memory units LMU<0> to LMU<7> in such a manner that these units transfer data at different timings. For example, when the LMU selection-address signal LSA selects an LMU<0> at the time of receiving the address strobe signal AST, the timing controller T/C drives the LMU<0> and the LMU<0> transfers data to the common data bus DB. When the LMU selection-address signal LSA selects an LMU<1> at the time of receiving the address strobe signal AST, the timing controller T/C drives the LMU<1> and the LMU<1> transfers data to the common data bus DB. In this way, the timing controller T/C can sequentially (continuously) transfer data from the local memory units LMU<0> to LMU<7> to the common data bus DB without overlapping the data with other data. Conversely, when the local memory units LMU<0> to LMU<7> receive data from the common data bus DB, the timing controller T/C can continuously transfer data from the common data bus DB to the local memory units LMU<0> to LMU<7> without overlapping the data with other data. That is, the local memory units LMU<0> to LMU<7> can perform the interleaving operation.

As explained above, according to the first embodiment, a timing controller is not arranged per local memory unit. Instead, a timing controller T/C is arranged per unit that shares the data bus DB and performs the interleaving operation (the unit is a group of the local memory units LMU<0> to LMU<7>, for example). Accordingly, in the interleaving operation, data which is sequentially transferred do not overlap with each other in the same common data bus DB. That is, read data or write data does not collide with each other in the common data bus DB. The present invention is explained below in more detail.

Figure 4:
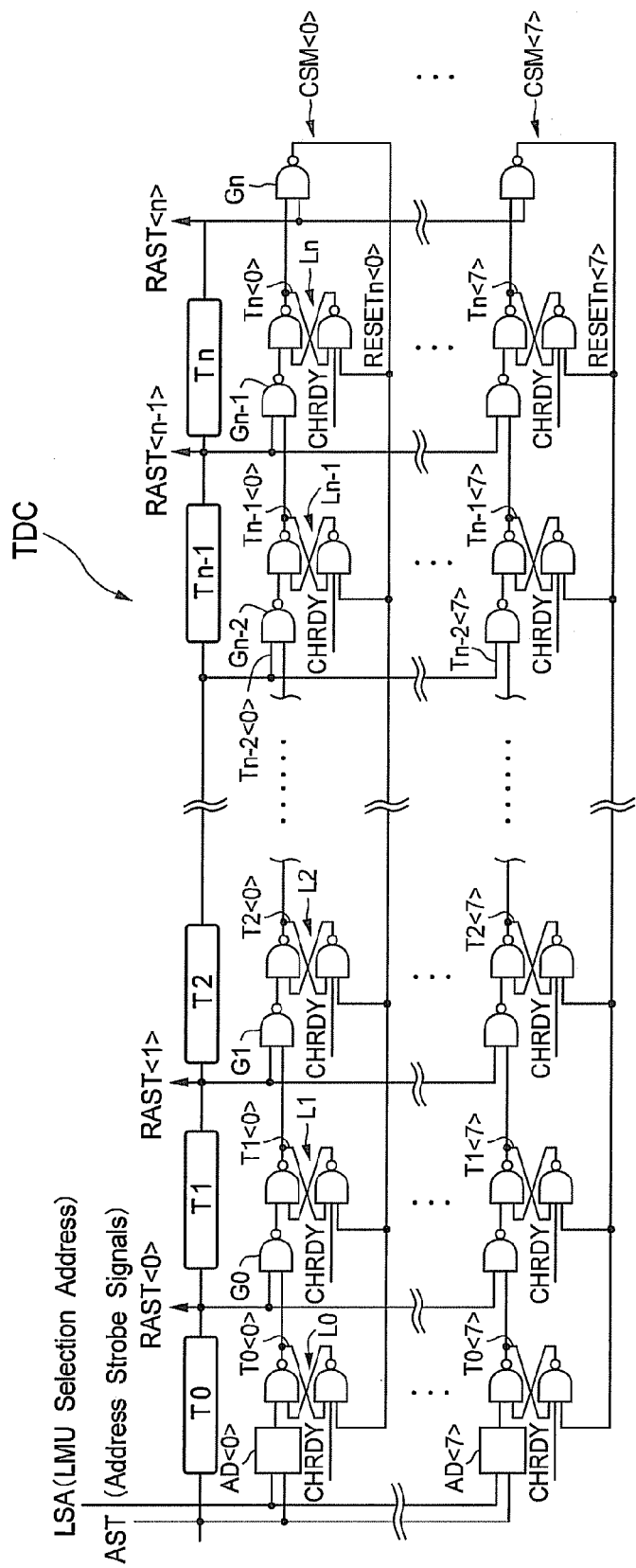
FIG. 4 is a configuration diagram of an internal configuration of the timing controller T/C according to the first embodiment.

FIG. 4 is a configuration diagram of an internal configuration of the timing controller T/C according to the first embodiment. The timing controller T/C includes a delay-time unit column TDC, cascade state machines CSM<0> to CSM<7>, address decoders AD<0> to AD<7>, and logical gates (NAND gates) G<0> to G<7>. The delay-time unit column TDC serving as a delay circuit is configured by serially connecting a plurality of delay time units T0 to Tn to each other and shared by eight cascade state machines CSM<0> to CSM<7>. In other words, the cascade state machines CSM<0> to CSM<7> are connected in parallel to a delay-time unit column TDC. Each of delay time units T0 to Tn−1 is configured to output the address strobe signal AST to next delay time units T1 to Tn after a predetermined delay time (for example, 2 ns) elapses since the address strobe signal AST is received. A first delay time unit T0 receives the address strobe signal AST from the address decoders AD<0> to AD<7>. A last delay time unit Tn outputs the address strobe signal AST to a logical gate Gn of a selected column. An internal configuration of the delay time units T0 to Tn is explained later with reference to FIG. 5.

The address decoders AD<0> to AD<7> are configured to receive the LMU selection-address signal LSA and decode it. The address decoders AD<0> to AD<7> operate the cascade state machines CSM<0> to CSM<7> based on the address strobe signal AST when their column is selected.

The cascade state machines CSM<0> to CSM<7> are provided so as to correspond to the local memory units LMU<0> to LMU<7>, respectively. Each of the cascade state machines CSM<0> to CSM<7> includes a plurality of SR (Set-Reset) latch circuits L0 to Ln and logical gates G0 to Gn.

Because configurations of the cascade state machines CSM<0> to CSM<7> are the same respectively, a configuration of a cascade state machine CSM<0> is explained below and explanations of configurations of other cascade state machines CSM<1> to CSM<7> will be omitted.

The SR latch circuits L0 to Ln each of which serves as a status latch unit are configured to be respectively provided to correspond to the delay time units T0 to Tn and latch the address strobe signal AST received from an address decoder AD<0> or logical gates G0 to Gn−1. Timings that the SR latch circuits L0 to Ln latch the address strobe signal AST are determined by the delay time units T0 to Tn. When a delay time unit Tk (k=0 to n) transmits the address strobe signal AST, a latch circuit Lk corresponding to this delay time unit Tk latches the address strobe signal AST. When the address strobe signal AST passes through all delay time units T0 to Tn, all SR latch circuits L0 to Ln are in a state of latching the address strobe signal AST. When a reset signal RESETn<0> is activated thereafter, data latched by all SR latch circuits L0 to Ln is reset. That is, the latch circuits L0 to Ln function as a status latch unit that indicates that corresponding delay time units T0 to Tn transmit the address strobe signal AST.

For example, the latch circuits L0 to Ln are initially set to output logical low. That is, nodes T0<0> to Tn<0> and control signals RAST<0> to RAST<n> are logical low. The address decoder AD<0> is originally deactivated to logical high.

When the LMU selection-address signal LSA is a signal selecting the cascade state machine CSM<0>, the address decoder AD<0> receives activation (logical high) of the address strobe signal AST and outputs logical low. Therefore, a latch circuit L0 latches logical high at a node T0<0>. After a predetermined delay time elapses, the delay time unit T0 outputs the address strobe signal AST (logical high). In this manner, a control signal RAST<0> is activated to logical high. A logical gate G0 receives an output value (logical high) from the latch circuit L0 and an output value (logical high) from the delay time unit T0 and outputs logical low to a latch circuit L1. The latch circuit L1 thus latches logical high at a node T1<0>. The address strobe signal AST from the delay time unit T0 is also output to the delay time unit T1.

After a predetermined delay time elapses, the delay time unit T1 outputs logical high of the address strobe signal AST. In this manner, a control signal RAST<1> is activated to logical high. A logical gate G1 receives an output value (logical high) from the latch circuit L1 and an output value (logical high) from the delay time unit T1 and outputs logical low to a latch circuit L2.

As explained above, the delay-time unit column TDC activates a control signal RAST<k> and transmits the address strobe signal AST to a next latch circuit Lk+1 after a delay time of the delay time unit Tk elapses since the latch circuit Lk latches the address strobe signal AST. Furthermore, the delay-time unit column TDC activates a control signal RAST<k+1> and transmits the address strobe signal AST to a next latch circuit Lk+2 after a delay time of a delay time unit Tk+1 elapses since the latch circuit Lk+1 latches the address strobe signal AST.

By repeating such an operation, the delay-time unit column TDC activates a control signal RAST<n> to logical high after the total delay time of the delay time units T0 to Tn elapses since the address strobe signal AST is input. That is, a time from when the address strobe signal AST is input to when the address strobe signal AST is output as the control signal RAST<n> is determined by the delay time units T0 to Tn.

According to the first embodiment, the control signals RAST<0> to RAST<n> are assigned to operate components of the local memory unit LMU<0>. For example, the control signal RAST<0> can be used for driving the main row decoder MRD and the local row decoder LRD and activating a selected word line WL. The control signal RAST<1> can be used as a sense-amplifier enable signal for activating the sense amplifier SA. A control signal RAST<2> can be used as a trigger for starting data detection. When the control signal RAST<n> is activated, read data from the local memory unit LMU<0> is transferred via the common data bus DB to the read buffer RB. In this way, the timing controller T/C can determine an operation timing of components of the memory, as well as a timing of transferring data to the common data bus DB.

By changing the LMU selection-address signal LSA, other cascade state machines CSM<1> to CSM<7> can be selected. At this time, the cascade state machines CSM<1> to CSM<7> operate similarly to the cascade state machine CSM<0> explained above. Therefore, the semiconductor storage device according to the first embodiment can centralize a delay circuit that manages a timing of the interleaving operation of the local memory units LMU<0> to LMU<7>.

As explained above, according to the first embodiment, the delay time units T0 to Tn are common to the cascade state machines CSM<0> to CSM<7>. Accordingly, even when any of the cascade state machines CSM<0> to CSM<7> is selected, a delay time from when the address strobe signal AST is input to when the address strobe signal AST is output as RAST<0> to RAST<n> is identical.

Figure 5A:
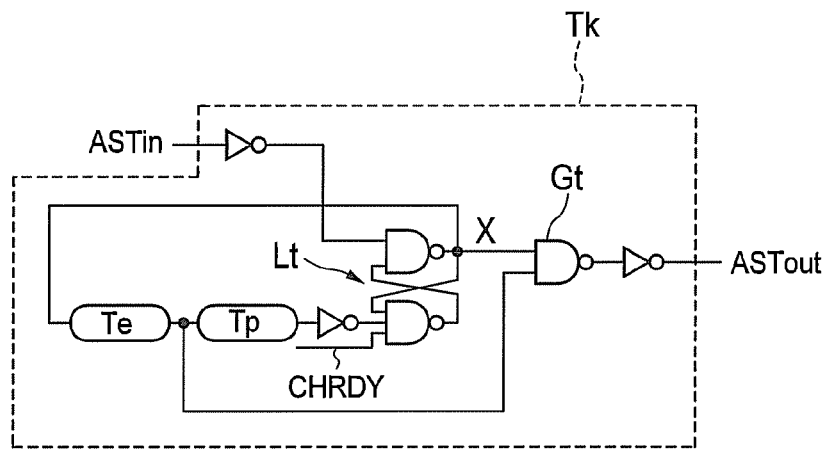
FIG. 5A is a configuration diagram of an internal configuration of a delay time unit Tk of the delay time units T0 to Tn. k is an integer of 0 to n.

FIG. 5A is a configuration diagram of an internal configuration of a delay time unit Tk of the delay time units T0 to Tn. k is an integer of 0 to n. As shown in FIG. 5A, the delay time unit Tk includes a latch circuit Lt, a delay element Te, a pulse-width-determining delay element Tp, and a logical gate Gt. The logical gate Gt receives an output of the latch circuit Lt and an output of the delay element Te and outputs a result of their NAND calculation. That is, the logical gate Gt activates an output to logical low when both the output of the latch circuit Lt and the output of the delay element Te are activated to logical high. The latch circuit Lt outputs a signal at a node X (for example, logical high) to the logical gate Gt and the delay element Te according to an input signal ASTin substantially with no delay. The latch circuit Lt has a function of latching the input signal ASTin. The delay element Te receives a latched signal at the node X and, after a predetermined delay time elapses, outputs the signal at the node X to the logical gate Gt and the pulse-width-determining delay element Tp. In this manner, the logical gate Gt outputs logical low after a predetermined delay time elapses since the input signal ASTin is input. That is, a timing of activating an output signal ASTout to logical high is such that after a predetermined delay time elapses since the input signal ASTin is input. In this way, the delay element Te can substantially determine a delay time of the address strobe signal AST in the delay time unit Tk.

The pulse-width-determining delay element Tp is connected between the delay element Te and the latch circuit Lt, receives an output signal from the delay element Te, and outputs the signal at the node X to the latch circuit Lt after a predetermined delay time. In this manner, the delay time unit Tk causes the output signal ASTout to fall after a delay time of the pulse-width-determining delay element Tp elapses since the output signal ASTout rises. That is, the pulse-width-determining delay element Tp has a function of determining a pulse width of the output signal ASTout.

Configurations of the delay time units T0 to Tn can be the same as that of the delay time unit Tk.

Figure 5B:
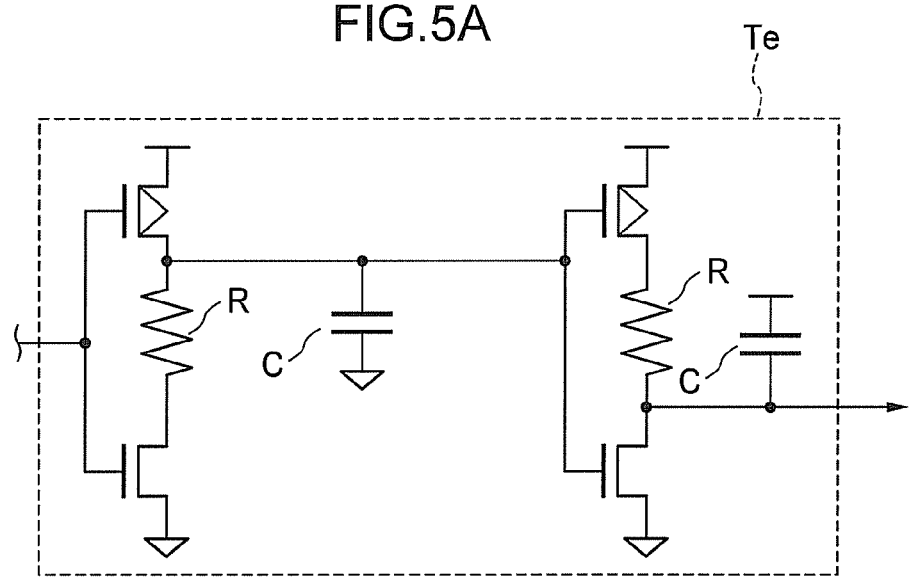
FIG. 5B is a circuit diagram of an internal configuration of the delay element Te.

FIG. 5B is a circuit diagram of an internal configuration of the delay element Te. As shown in FIG. 5B, the delay element Te can be configured by a CR delay circuit. A delay time of the delay element Te can thus be set depending on the size of C (Capacitor) and R (Resistor). The capacitor C can be formed by using a gate capacitor. The resistor R can be formed by using a diffusion layer resistor or a polysilicon resistor.

Figure 5C:
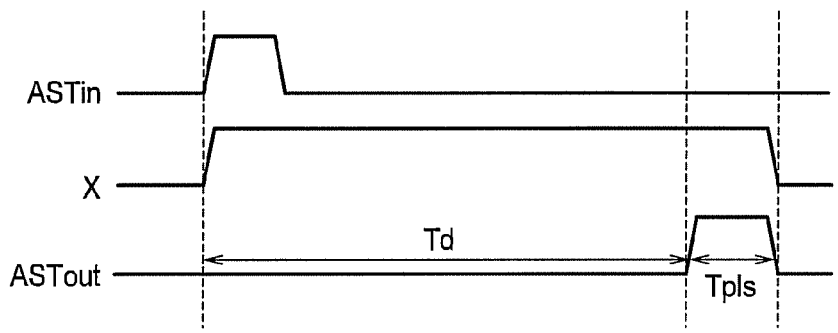
FIG. 5C is a timing diagram of an operation of the delay time unit Tk.

FIG. 5C is a timing diagram of an operation of the delay time unit Tk. When the input signal ASTin is activated to logical high, the node X is latched at logical high without any delay. After a delay time Td elapses, the delay element Te outputs the signal at the node X to the logical gate Gt. The logical gate Gt thus outputs logical low and the output signal ASTout is activated to logical high.

After a delay time Tpls elapses, the pulse-width-determining delay element Tp outputs an inversion signal at the node X to the latch circuit Lt. In this manner, the signal at the node X is latched at logical low and the output signal ASTout is deactivated to logical low.

As explained above, the input signal ASTin is output as the signal ASTout having a pulse width of Tpls after the delay time Td elapses. The configuration of the delay time unit Tk is not particularly limited, and the delay time unit Tk can be an inverter delay circuit, a simple RC delay circuit, or a delay circuit using a constant current source.

Figure 6:
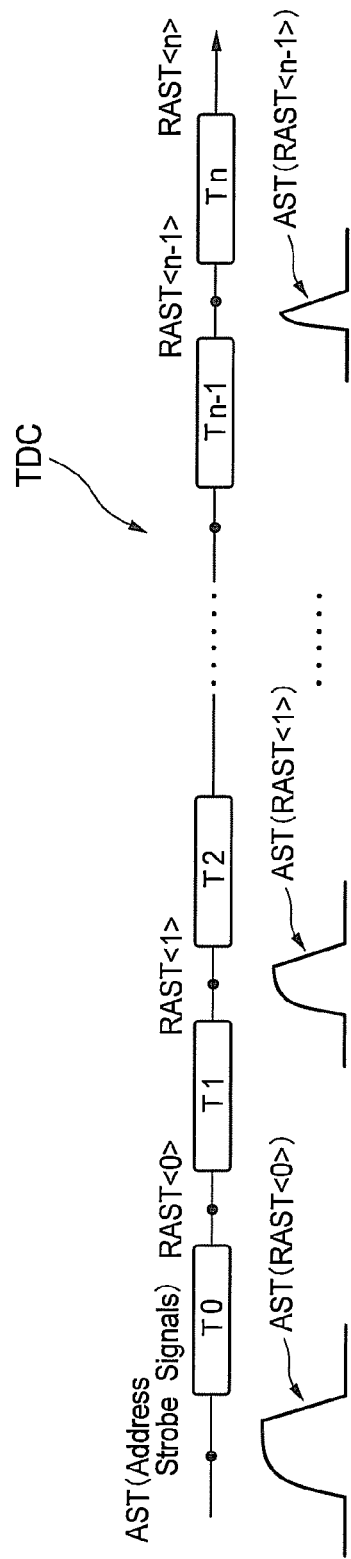
FIG. 6 is a diagram showing a reference embodiment in which the pulse width of the address strobe signal AST is degraded.

When the latch circuit Lt, the pulse-width-determining delay element Tp, and the logical gate Gt shown in FIG. 5A are omitted and a inverter to which an RC delay circuit is attached as shown in FIG. 5B is simply used as the delay time unit Tk, the pulse width of the address strobe signal AST is degraded (shortened) as the address strobe signal is transmitted to subsequent stages of the delay time units T0 to Tn. For example, as shown in FIG. 6, the pulse width of the address strobe signal AST is degraded as the address strobe signal is transmitted from the delay time unit T0 to the delay time unit Tn. In this case, the timing controller T/C may not normally function and a wrong operation may be induced.

To handle such a problem, according to the first embodiment, the pulse width is recovered by providing the latch circuit Lt, the pulse-width-determining delay element Tp, and the logical gate Gt as shown in FIG. 5A. As shown in FIG. 5C, the pulse width of the address strobe signal AST is set to Tpls in the respective delay time units T0 to Tn. For example, it suffices that the pulse-width-determining delay element Tp has a simple configuration of connecting inverters of a fan-out of about 3 by even-number stages. The delay time Tpls can be about 1 ns, for example. In this way, according to the first embodiment, the pulse width of the address strobe signal AST can be maintained.

The semiconductor storage device according to the first embodiment centralizes a delay circuit that manages a timing of the interleaving operation. Accordingly, a delay time of data transfer in the local memory units LMU<0> to LMU<7> sharing the common data bus DB does not vary. Therefore, it is possible to prevent the local memory units LMU<0> to LMU<7> from transferring data in an overlapped manner in the common data bus DB. Alternatively, it is possible to prevent data from being transferred from the common data bus DB to the local memory units LMU<0> to LMU<7> in an overlapped manner.

For example, assume that a delay circuit is provided for each of the local memory units LMU<0> to LMU<7> and the delay time of each delay circuit is 30 ns as in conventional cases. When such a memory is actually manufactured, the delay time of each delay circuit varies according to process variations. Assume that the variations in the delay time are ±10%, the delay time of a delay circuit may be 33 ns, and the delay time of other delay circuits may be 27 ns. In this case, a time interval between two pieces of data continuously propagating through a data bus may be reduced by 6 ns. When a plurality of local memory units continuously perform the interleaving operation every 5 ns, the two pieces of data collide with each other in the common data bus DB.

On the other hand, according to the first embodiment, the delay time of data transfer in the local memory units LMU<0> to LMU<7> sharing the common data bus DB does not vary. Accordingly, it is possible to prevent a plurality of pieces of data from colliding with each other in the common data bus DB.

Furthermore, a capacitor and a resistor of a delay element generally require a certain layout area. According to the first embodiment, by centralizing the delay circuit that manages the timing of the interleaving operation, a layout area of the timing controller T/C can be reduced as compared to conventional cases.

Figure 7:
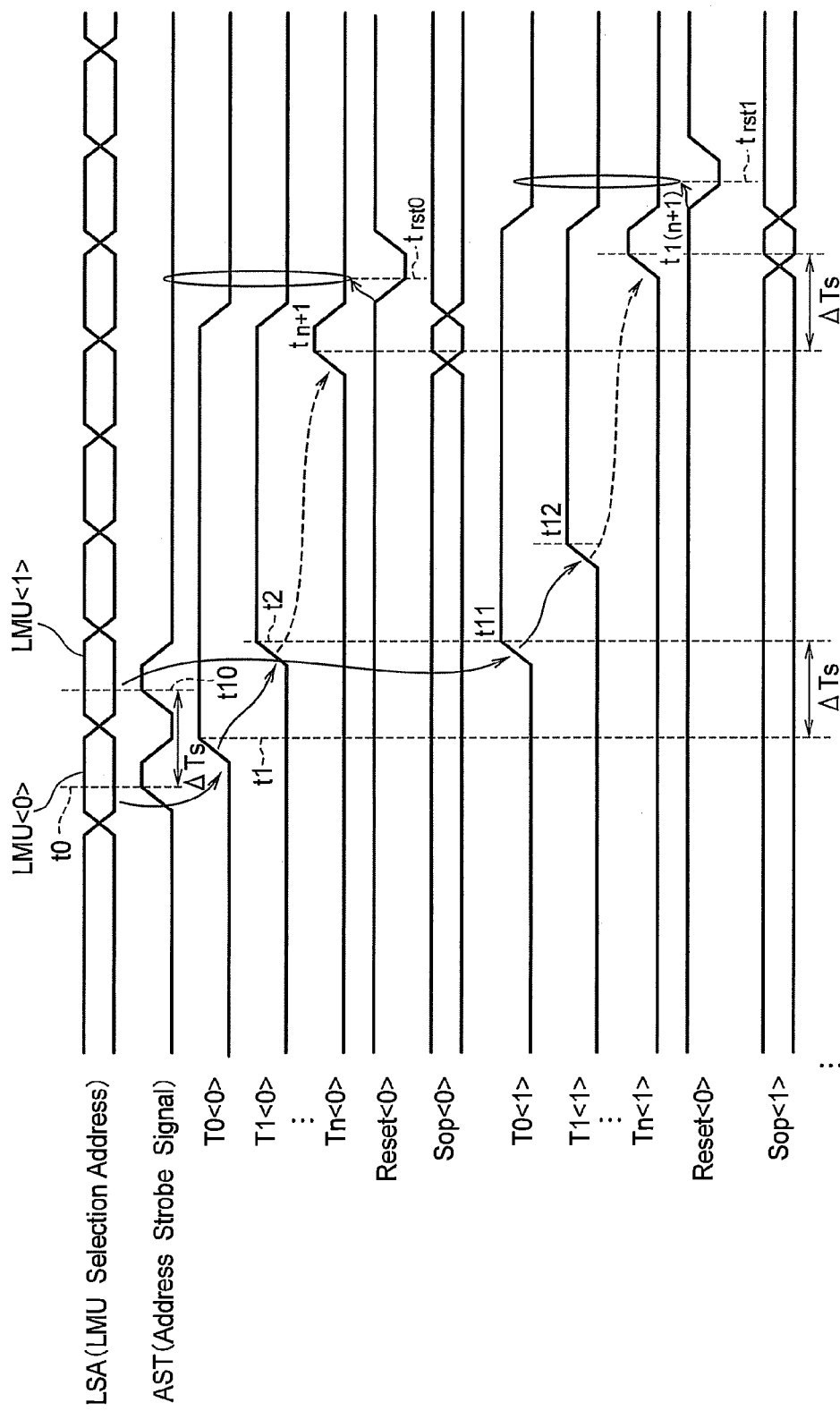
FIG. 7 is a timing diagram of a data read operation of the semiconductor storage device according to the first embodiment.

FIG. 7 is a timing diagram of a data read operation of the semiconductor storage device according to the first embodiment. FIG. 7 shows the interleaving operation when two local memory units LMU<0> and LMU<1> are continuously accessed. Needless to mention, the semiconductor storage device according to the first embodiment can continuously access more local memory units to perform the interleaving operation.

When the LMU selection address LSA and the address strobe signal AST are input to the timing controller T/C at t0, the timing controller T/C drives a cascade state machine CSM according to the LMU selection address LSA. When the LMU selection address LSA is an address selecting the local memory unit LMU<0>, the timing controller T/C drives the cascade state machine CSM<0> corresponding to the local memory unit LMU<0>.

As explained above, the delay-time unit column TDC activates the control signals RAST<0> to RAST<n> while delaying the address strobe signal AST by a predetermined delay time. The delay-time unit column TDC inverts latch states of the latch circuits L0 to Ln of the cascade state machine CSM<0> in turn while delaying the address strobe signal AST by a predetermined delay time.

The latch circuit L0 is inverted first by the address strobe signal AST (t1). When the delay time of the delay time unit T0 elapses, the control signal RAST<0> is activated and the latch state of the latch circuit L1 is inverted (t2). Furthermore, when the delay time of the delay time unit T1 elapses, the control signal RAST<1> is activated and the latch state of the latch circuit L2 is inverted (t3). When the delay-time unit column TDC and the cascade state machine CSM<0> repeat such an operation and a latch circuit Ln makes a node Tn<0> rise at tn+1, the logical gate Gn activates the reset signal RESETn<0> to logical low at trst0. By the reset signal RESETn<0> being activated to logical low, all latch circuits L0 to Ln in the cascade state machine CSM<0> are reset to be in an initial state.

After ΔTs (for example, 5 ns) since the LMU selection address LSA and the address strobe signal AST are received at t0, a next LMU selection address LSA and a next address strobe signal AST are input to the timing controller T/C (t10). When the LMU selection address LSA is an address selecting the local memory unit LMU<1>, the timing controller T/C drives the cascade state machine CSM<1> corresponding to the local memory unit LMU<1>.

The delay-time unit column TDC then activates the control signals RAST<0> to RAST<n> while delaying the address strobe signal AST by a predetermined delay time. The delay-time unit column TDC inverts latch states of the latch circuits L0 to Ln of the cascade state machine CSM<1> in turn while delaying the address strobe signal AST by a predetermined delay time.

The latch circuit L0 is inverted first by the address strobe signal AST (t11). Thereafter, when the delay time of the delay time unit T0 elapses, the control signal RAST<0> is activated and the latch state of the latch circuit L1 is inverted (t12). Furthermore, when the delay time of the delay time unit T1 elapses, the control signal RAST<1> is activated and the latch state of the latch circuit L2 is inverted (t13). By the cascade state machine CSM<1> repeating such an operation and the latch circuit Ln making the node Tn<1> rise at t1(n+1), the logical gate Gn activates a reset signal RESETn<1> to logical low at trst1. By the reset signal RESETn<1> being activated to logical low, all latch circuits L0 to Ln in the cascade state machine CSM<1> are reset to be in an initial state.

A time interval between two continuous address strobe signals AST input to the cascade state machines CSM<0> and CSM<1> is ΔTs. A time interval between an activation timing of the control signals RAST<0> to RAST<n> of the cascade state machine CSM<0> and an activation timing of the control signals RAST<0> to RAST<n> of the cascade state machine CSM<1> is also ΔTs that is the same as the time interval of a strobe. This is because the cascade state machines CSM<0> and CSM<1> share the delay-time unit column TDC and thus their time intervals ΔTs are coincide with each other. This can be applied to other cascade state machines CSM<2> to CSM<n>. Accordingly, when a plurality of LMU selection addresses LSA and a plurality of address strobe signals AST are continuously input every time interval ΔTs, the timing controller T/C according to the first embodiment can continuously activate the control signals RAST<0> to RAST<n> corresponding to the LMU selection address LSA while maintaining the time interval ΔTs. Consequently, the MRAM according to the first embodiment can drive the local memory units LMU<0> to LMU<7> according to the time interval ΔTs of the address strobe signal AST.

While the data read operation has been explained above, the first embodiment can use the same timing controller T/C to perform the interleaving operation in a data write operation. In this case, any signal RAST<k> of the control signals RAST<0> to RAST<n> shown in FIG. 4 is used to drive the write driver WD. The control signal RAST<k+1> is then used to transfer write data via the common data bus DB to the write driver WD. A signal RAST<k+2> is then used to start data write from the write driver WD to the memory cell MC. The write operation may be finished by activation of the control signal RAST<n>. Accordingly, also in the interleaving operation in the data write, it is possible to prevent a plurality of pieces of write data from colliding with each other in the common data bus DB. Because configurations and operations of the timing controller T/C are identical to those of FIGS. 4, 5, and 7, explanations thereof will be omitted.

While a timing controller T/C used for data read and a timing controller T/C used for data write can be provided separately, they can be in common. By having the timing controller T/C to be in common, the chip size of the MRAM can be further reduced.

The delay times of the respective delay time units T0 to Tn need to be shorter than the time interval ΔTs (an operation cycle of a local memory unit LMU) between continuous plural address strobe signals AST in the interleaving operation. Conversely, it can be said that the time interval ΔTs between a plurality of address strobe signals AST need to be longer than the delay time of each of the delay time units T0 to Tn. This is because when the time interval ΔTs between a plurality of address strobe signals AST is equal to or shorter than the delay time of any of the delay time units T0 to Tn, the address strobe signals AST may be fetched in the same delay time unit Tk. The delay times of the respective delay time units T0 to Tn do not need to be set to be equal and can be different from each other as long as the respective delay times are within ΔTs.

Second Embodiment

Figure 8:
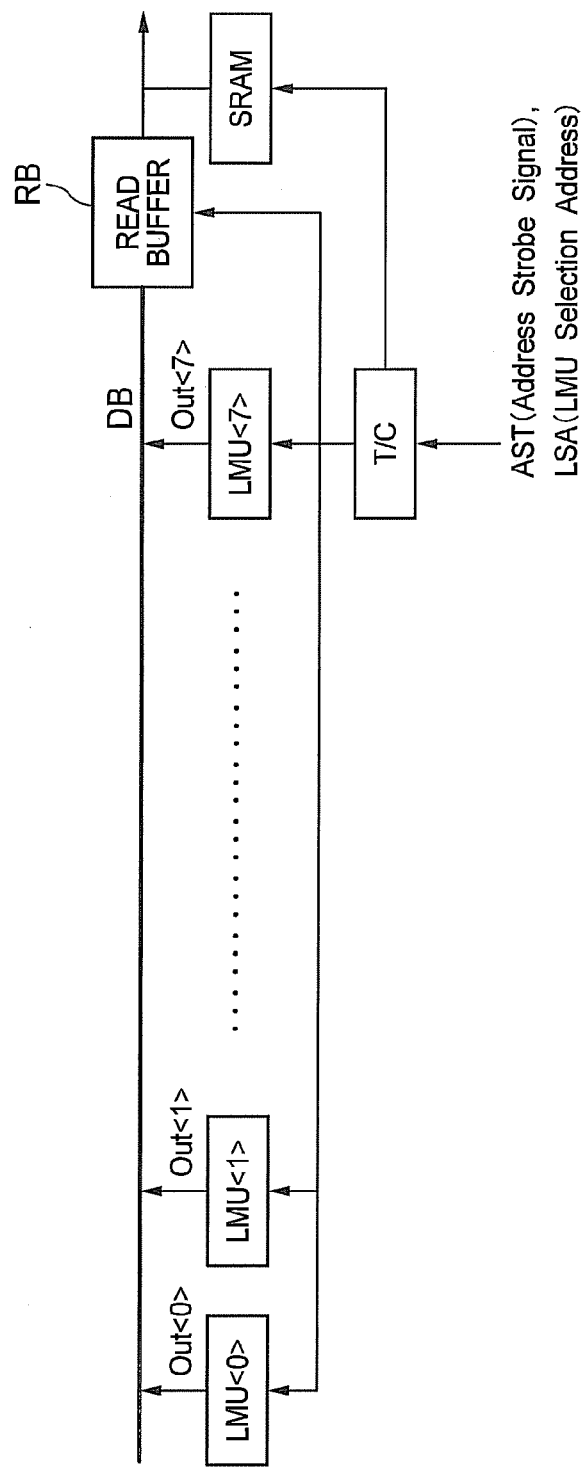
FIG. 8 is a block diagram of a relationship between a common data bus DB, local memory units LMU<0> to LMU<7>, and a timing controller T/C according to a second embodiment.

FIG. 8 is a block diagram of a relationship between a common data bus DB, local memory units LMU<0> to LMU<7>, and a timing controller T/C according to a second embodiment. The second embodiment is different from the first embodiment in that an SRAM is connected to an output part of a read buffer RB. The SRAM is controlled by the timing controller T/C so as to be able to perform an interleaving operation. Other configurations of the second embodiment can be identical to the corresponding ones of the first embodiment.

The SRAM is used as a cache memory and holds data of an address previously accessed in a read operation with that address. When a memory of the same address is accessed, the SRAM outputs the held data. In this manner, when multiple accesses are made to the memory of the same address at the time of read, the MRAM according to the second embodiment can quickly output read data without accessing memory cells MC again.

In the first and second embodiments, the delay time is generated from the address strobe signal AST in an analog manner by utilizing an RC delay. Meanwhile, a method of counting external clocks by a counter to measure the delay time is also conceivable. In a case of a digital method of using a counter, even when a timing controller is arranged for every local memory unit LMU, variations in the delay time do not exist and read data or write data does not collide with each other in the common data bus DB. However, in this case, timings of the respective control signals naturally depend on an external clock frequency. Generally, according to the external clock frequency that is the basis of an operation frequency of a semiconductor storage device, only its upper limit (that is, the highest frequency) is specified and the semiconductor storage device can be operated slowly as long as it is lower than the upper limit in most cases. In this case, when the external clock frequency is low, the timings of the control signals become slow and an interval between control signals is extended. For example, according to an MRAM including an MTJ element of a spin-injection writing system, when an activation time of a sense amplifier SA (a time during which a cell current flows in an MTJ element) is extended at the time of data read, a logic of data of the MTJ element may be inverted (read disturb). Accordingly, the method of generating the delay time using external clocks is not preferable.

Therefore, the above embodiments do not use a method of counting external clocks to generate a delay time, and instead utilize the RC delay to generate the delay time from the address strobe signal AST. Accordingly, the delay time can be maintained to be constant without depending on the external clock frequency. As a result, the above embodiments can suppress the read disturb.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A timing controller comprising:
   a plurality of delay time units connected in series and shared by memory units sharing a data bus;
   a plurality of status latch parts respectively corresponding to the delay time units and latching an input signal transmitted by a corresponding delay time unit,
   wherein the delay time units respectively comprise: a latch circuit latching an input signal; a delay element outputting a latched signal in the latch circuit after a predetermined delay time elapses since receiving the input signal; and a logical gate activating a control signal for driving the memory units when both an output of the latch circuit and an output of the delay element are activated; and
   a pulse-width-determining delay element connected between the delay element and the latch circuit, the pulse-width-determining delay element being configured to determine a pulse width of a signal output from the logical gate.

2. The timing controller of claim 1 is shared by the memory units which sequentially send data to the data bus without overlapping the data with other data or which sequentially receive data from the data bus without overlapping the data with other data.

3. The timing controller of claim 1, wherein the status latch parts share the delay time units.

4. The timing controller of claim 2, wherein the status latch parts share the delay time units.

5. The timing controller of claim 1, wherein a plurality of control signals respectively output from the delay time units are used for operating a selected one of the memory units.

6. The timing controller of claim 2, wherein a plurality of control signals respectively output from the delay time units are used for operating a selected one of the memory units.

7. The timing controller of claim 1, wherein the status latch parts are SR latch circuits.

8. The timing controller of claim 3, wherein the status latch parts are SR latch circuits.

9. The timing controller of claim 5, wherein the status latch parts are SR latch circuits.

10. The timing controller of claim 1, further comprising a cache memory connected to an output part of the data bus, the cache memory being configured to store therein data read from the memory units.

11. The timing controller of claim 2, further comprising a cache memory connected to an output part of the data bus, the cache memory being configured to store therein data read from the memory units.

* * * * *